(12) United States Patent
Hata et al.

(10) Patent No.: US 6,555,847 B2
(45) Date of Patent: Apr. 29, 2003

(54) NITRIDE BASED SEMICONDUCTOR LIGHT EMITTING ELEMENT

(75) Inventors: Toshio Hata, Nara (JP); Mayuko Fudeta, Nara (JP); Kensaku Yamamoto, Nara (JP); Masaki Tatsumi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 175 days.

(21) Appl. No.: 09/837,197

(22) Filed: Apr. 19, 2001

(65) Prior Publication Data

US 2001/0045561 A1 Nov. 29, 2001

(30) Foreign Application Priority Data

Apr. 19, 2000 (JP) ........................................ 2000-117921

(51) Int. Cl.[7] ........................... H01L 33/00; H01L 29/22
(52) U.S. Cl. ......................................... 257/103; 257/78
(58) Field of Search ................................. 257/78, 103

(56) References Cited

U.S. PATENT DOCUMENTS 6,456,639 B2 * 9/2002 Ishibashi et al.

FOREIGN PATENT DOCUMENTS

| JP | A9129919 | 5/1997 |
|---|---|---|
| JP | A10321913 | 12/1998 |

\* cited by examiner

Primary Examiner—Stephen D. Meier
(74) Attorney, Agent, or Firm—Birch, Stewart, Kolasch, & Birch, LLP.

(57) ABSTRACT

A nitride based semiconductor light emitting element includes at least a gallium nitride based compound semiconductor layer of a first conductivity type and a gallium nitride based compound semiconductor layer of a second conductivity type stacked on a substrate. On a main region of the top surface of the semiconductor layer of the second conductivity type, a Pd-containing electrode is formed, and the top surface and side surfaces of the Pd-containing electrode as well as the surface of the semiconductor layer of the second conductivity type in a region of at least a prescribed width from the side surfaces are covered by a conductive shielding film to be shielded from the atmosphere or a mold resin.

7 Claims, 5 Drawing Sheets

NITRIDE BASED SEMICONDUCTOR LIGHT EMITTING ELEMENT

BACKGROUND OF THE INVENTION

1. Field of the Invention

The present invention relates to a gallium nitride based compound semiconductor light emitting element capable of emitting light beams in the blue to ultraviolet ranges, and more specifically to an electrode structure thereof.

2. Description of the Background Art

A schematic cross sectional view of FIG. 5 shows a stacked structure of an example of a conventional gallium nitride based compound semiconductor light emitting element (see Japanese Patent Laying-Open No. 9-129919). In this light emitting element, on an insulating sapphire substrate 100, an n type contact layer 200, a light emitting layer 300, a p type clad layer 400 and a p type contact layer 410 are stacked in this order. On a main region on a top surface of p type contact layer 410, a first p type electrode layer 500 of metal is formed. On a first region on the top surface of the first p type electrode layer 500, a second p type electrode layer 600 of a transparent conductive film containing oxide is formed, and on the remaining second region, a pad electrode 700 is formed. Further, a portion of n type contact layer 200 is exposed by anisotropic etching, and an n type electrode 800 is formed on the exposed region.

In the electrode structure of the light emitting element such as shown in FIG. 5, the top surface of the first p type electrode 500 is covered either by the second p type electrode layer 600 or the pad electrode 700. Side surfaces of the first p type electrode 500, however, are exposed to the atmosphere. Further, portions of the top surface of p type contact layer 410 that are not covered by the first p type electrode 500 are exposed.

The inventors of the present invention performed a conduction test of the light emitting element having such an electrode structure in the atmosphere and in a lump state formed of a mold resin, and it was found that when the first p type electrode layer 500 contains palladium (Pd), local bumps generate at the upper surface of p type contact layer 410 on the side surfaces and near the side surfaces of the first p type electrode layer, resulting in a particular phenomenon that the bumps turned out to be dark spaces of the light emitting region. More specifically, such a bump portion is a cause of unevenness of the light emitting pattern from the light emitting region, deteriorating reliability of the light emitting element. Further, it was found that when p type and n type pad electrodes are arranged at diagonal directions of the light emitting element, such bumps are more frequently generated on the side surfaces of the first p type electrode layer and the top surface regions of the p type contact layer 410 near the side surfaces, nearer to the region having high current density along the shortest distance between the pad electrodes.

SUMMARY OF THE INVENTION

In view of the problems experienced in the conventional light emitting element found by the inventors, an object of the present invention is to provide a nitride based semiconductor light emitting element having high reliability capable of uniform light emission in the overall light emitting regions under a low forward voltage.

According to the present invention, the nitride based semiconductor light emitting element includes at least a gallium nitride based compound semiconductor layer of a first conductivity type and a gallium nitride based compound semiconductor layer of a second conductivity type stacked on a substrate, a Pd-containing electrode is formed on a main region on the top surface of the semiconductor layer of the second conductivity type, and the top surface and side surfaces of the Pd-containing electrode as well as the surface of the semiconductor layer of the second conductivity type in an area of at least a prescribed width W from the side surfaces are covered by a conductive shielding film to be shielded from the atmosphere or a mold resin.

The Pd-containing electrode may be formed as a transparent electrode, and the conductive shielding film may be formed by a transparent conductive film.

A pad electrode may be formed on a region on the top surface of the Pd-containing electrode and, in that case, it is preferred that the conductive shielding film additionally covers the side surfaces and the peripheral portion of the top surface of the pad electrode.

A Pd-containing electrode may be formed as an ohmic electrode, and the conductive shielding film may be formed to serve additionally as the pad electrode.

The Pd-containing electrode may be formed as a single-layer or multi-layered metal thin film.

When the conductive shielding film is formed by a transparent conductive film, the thickness thereof should preferably be 0.1 $\mu$m to 30 $\mu$m and the aforementioned width W should preferably be at least 5 $\mu$m.

When the conductive shielding film is formed to serve additionally as the pad electrode, it should preferably contain at least gold (Au), and the thickness thereof should be 0.3 $\mu$m to 1.5 $\mu$m and the aforementioned width should preferably be at least 5 $\mu$m.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
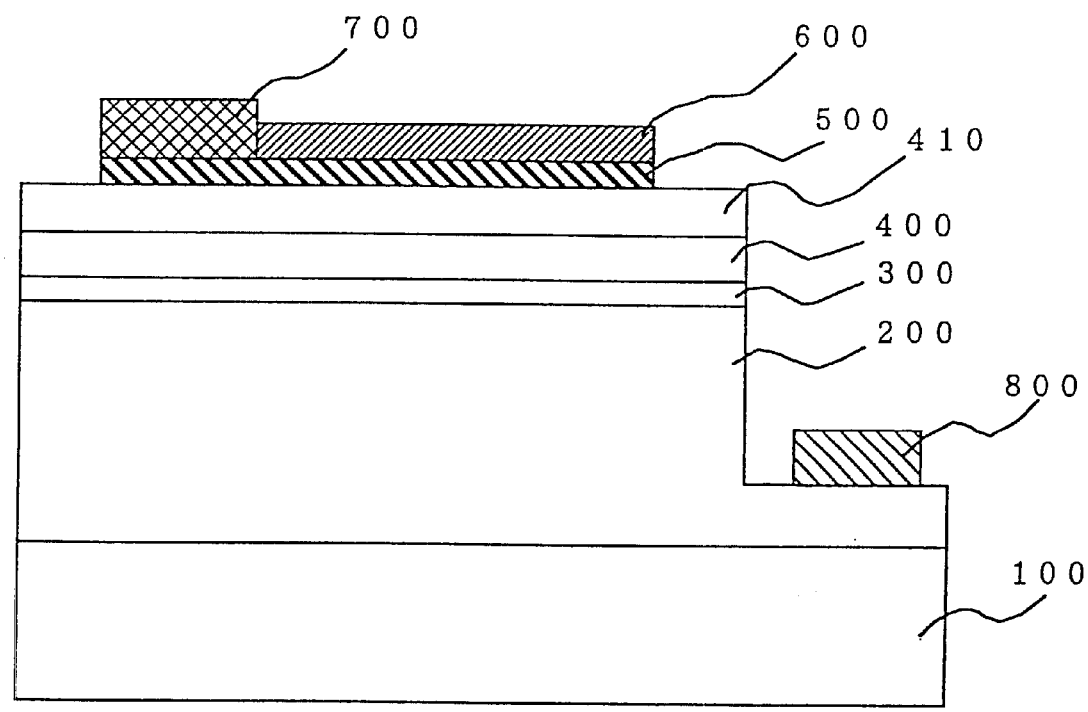
FIG. 5 is a schematic cross sectional view showing a stacked structure of a conventional gallium nitride based compound semiconductor element.

The inventors examined in detail the problems experienced in the electrode structure of the conventional light emitting element shown in FIG. 5 described above. It was found that the bumps are generated on the side surfaces of the first p type electrode layer 500 containing Pd and on the surfaces of the p type contact layer 410 near the side surfaces possibly because Pd having high reactivity with hydrogen absorbs hydrogen, oxygen and moisture from the atmosphere and from the mold resin. Based on the knowledge of the problems of the electrode structure of the conventional light emitting element found by the inventors, some embodiments will be described, as specific implementations of the present invention. As the gallium nitride based semiconductor used in the light emitting element in accordance with the present invention, $In_xAl_yGa_{1-x-y}N$ ($0 \leq x$, $0 \leq y$, $x+y \leq 1$), for example, may be used. Further, the semiconductor light emitting element includes a light emitting diode and a semiconductor laser.

First Embodiment

Figure 1:
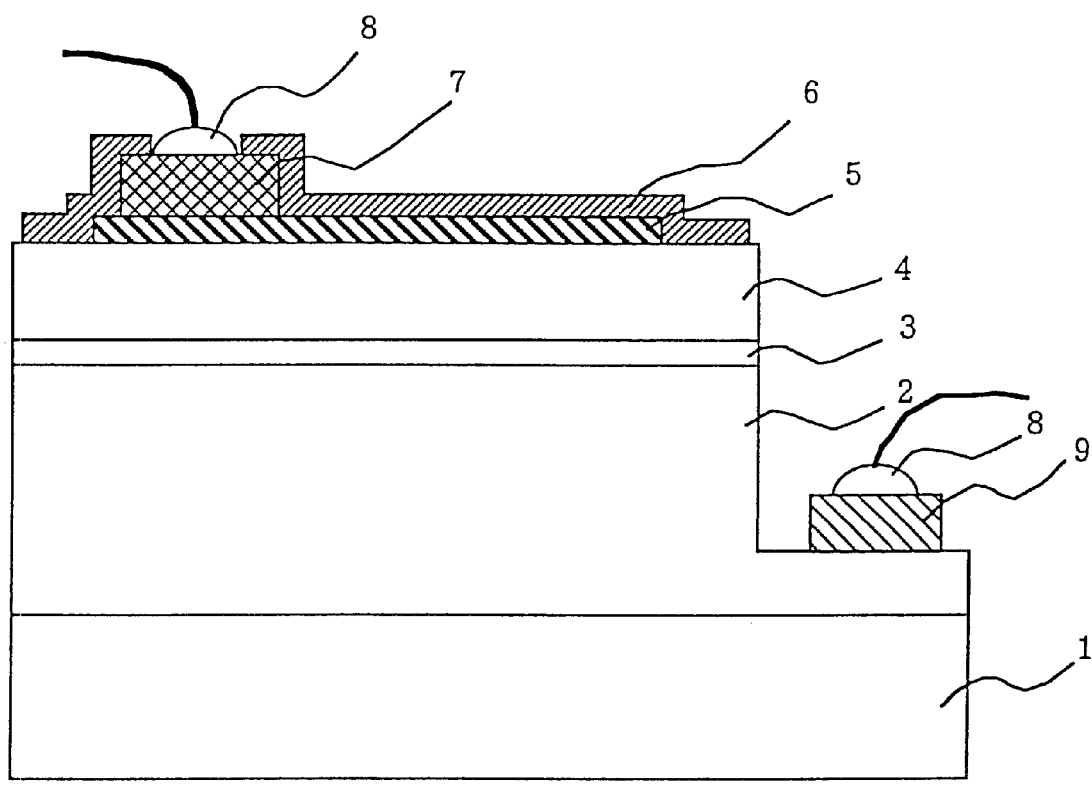
FIG. 1 is a schematic cross sectional view showing a stacked structure of a gallium nitride based compound semiconductor element in accordance with the first embodiment of the present invention.

FIG. 1 is a schematic cross sectional view showing a gallium nitride based compound semiconductor light emitting element in accordance with the first embodiment of the present invention. The light emitting element includes a sapphire substrate 1, an n type gallium nitride based compound semiconductor layer 2, a gallium nitride based compound semiconductor light emitting layer 3, a p type gallium nitride based compound semiconductor layer 4, a transparent electrode 5, a transparent conductive film 6, a pad electrode 7, an Au bonding wire 8 and an n type electrode 9.

In manufacturing such a light emitting element as shown in FIG. 1, first, on sapphire substrate 1, n type gallium nitride based compound semiconductor layer 2, gallium nitride based compound semiconductor light emitting layer 3 and p type gallium nitride based compound semiconductor layer 4 are stacked in this order by a known method. On p type gallium nitride based compound semiconductor layer 4, a transparent Pd electrode layer 5 having the thickness of about 2 nm is formed by vacuum vapor deposition or electron beam deposition. The transparent Pd electrode layer 5 is patterned to the transparent electrode 5 by a common photoetching using a photoresist.

On a region of transparent electrode 5, pad electrode 7 of Au layer having the thickness of about 500 nm is formed using, for example, a metal mask.

Thereafter, transparent conductive film 6 of Sn-doped $In_2O_3$ having the thickness of about 500 nm is formed to cover all the exposed surfaces of p type semiconductor layer 4, transparent electrode 5 and pad electrode 7. The transparent conductive film 6 is patterned by using an etching solution of iron chloride base, for example. Thus patterned transparent conductive film 6 covers not only the top surface but also side surfaces of transparent electrode 5, covers the top surface of p type compound semiconductor layer 4 in the region having the width of at least about 5 μm from the side surfaces, and covers the side surfaces and the region having the width of at least about 5 μm at the periphery of the top surface of pad electrode 7.

Thereafter, by dry etching using the resist as a mask, a part of n type gallium nitride based compound semiconductor layer 2 is exposed. On the exposed surface of n type compound semiconductor layer 2, the n type electrode 9 is formed. A stacked layer including an Al layer having the thickness of about 150 nm and a Ti layer having the thickness of about 20 nm may be formed as the n type electrode 9.

Finally, in order to form electrical connection between the light emitting element and the outside, Au bonding wire 8 is connected to the central region of the top surface of pad electrode 7 where the transparent conductive film 6 has been removed. Similarly, Au bonding wire 8 is connected additionally to n type electrode 9.

In the light emitting element shown in FIG. 1 formed in this manner, the Pd electrode 5 has superior ohmic characteristic with respect to the p type gallium nitride based compound semiconductor layer 4 and, because of its very small thickness, it can be transparent. Of the top surface and the side surfaces of the transparent Pd electrode, regions that are not covered by pad electrode 7 are all covered by the transparent conductive film 6 to be shielded from the atmosphere or from the mold resin.

A conduction test was performed on the light emitting element of FIG. 1 in the atmosphere and in the lump state formed by a mold resin. Generation of the bumps near the side surfaces of the Pd electrode that were observed in the conventional light emitting element was not observed, the light emission pattern of the light emitting region was uniform and reliability of the light emitting element was improved.

It is considered that in the light emitting element shown in FIG. 1, transparent conductive film 6 serves as a shielding film that shields and protects the surface of transparent Pd electrode 5 from the atmosphere or from the mold resin, so that reaction between Pd contained in transparent electrode 5 and the hydrogen, oxygen and moisture from the atmosphere and the mold resin can be prevented, and hence degradation of the characteristics of the light emitting element can be prevented.

Second Embodiment

Figure 2:
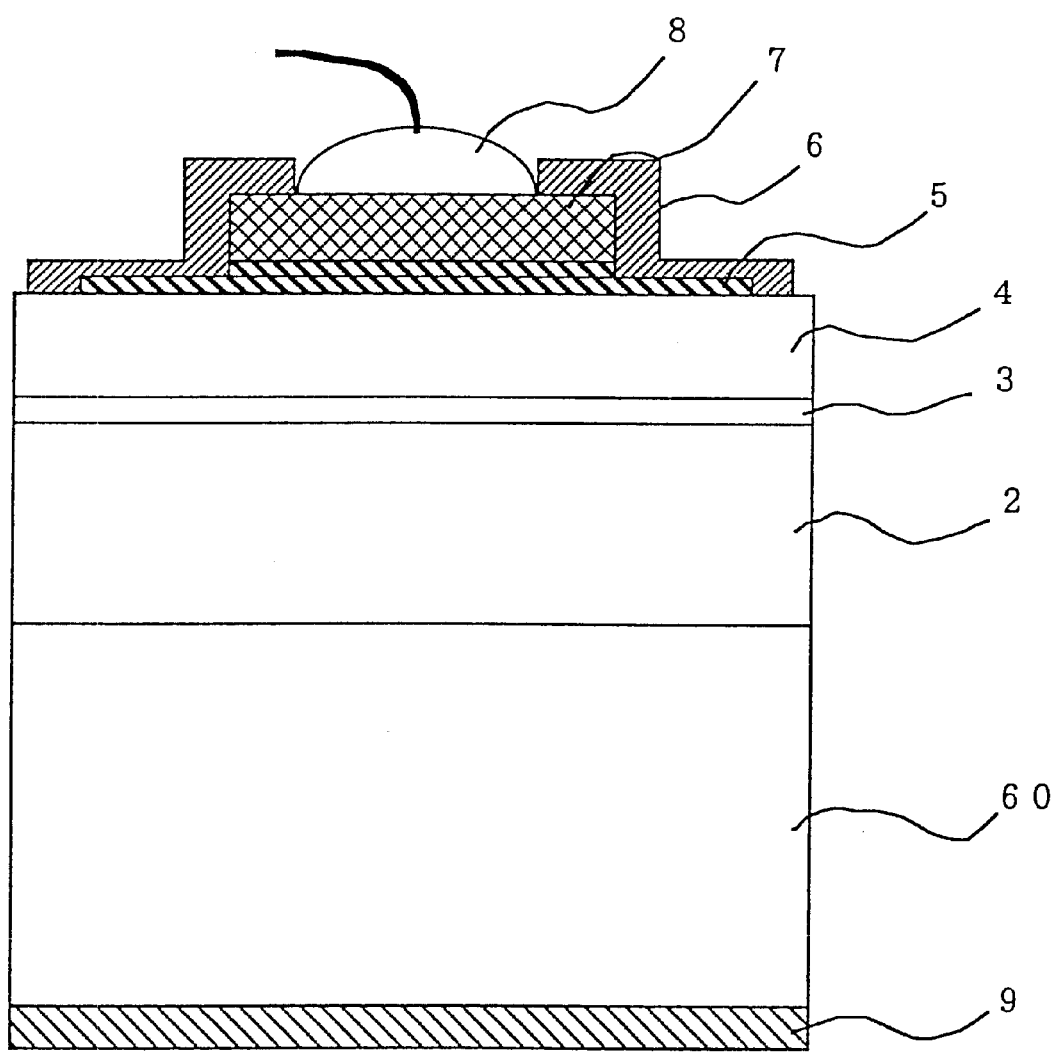
FIG. 2 is a schematic cross sectional view showing a stacked structure of a gallium nitride based compound semiconductor element in accordance with the second embodiment of the present invention.

FIG. 2 is a schematic cross sectional view showing a gallium nitride based compound semiconductor light emitting element in accordance with the second embodiment of the present invention. The light emitting element includes an n type GaN substrate 60, an n type gallium nitride based compound semiconductor layer 2, a gallium nitride based compound semiconductor light emitting layer 3, a p type gallium nitride based compound semiconductor layer 4, a transparent electrode 5, a transparent conductive film 6, a pad electrode 7, an Au bonding wire 8 and an n type electrode 9.

In manufacturing such a light emitting element as shown in FIG. 2, first, on n type GaN substrate 60, n type gallium nitride based compound semiconductor layer 2, gallium nitride based compound semiconductor light emitting layer 3 and p type gallium nitride based compound semiconductor layer 4 are stacked in this order by a known method. On p type gallium nitride based compound semiconductor layer 4, a transparent Pd electrode layer 5 having the thickness of about 4 nm is deposited. The transparent electrode 5 is patterned in the similar manner as in the first embodiment.

On the patterned transparent electrode 5, pad electrode 7 is formed by using a metal mask. Pad electrode 7 is formed as a stacked layer including a Pd layer having the thickness of about 50 nm and an Au layer having the thickness of about 450 nm. The pad electrode 7 may be formed utilizing the lift-off method.

Thereafter, transparent conductive film 6 of Sn-doped $InO_3$ having the thickness of about 600 nm is deposited to cover the top surface of p type semiconductor layer 4 and exposed surfaces of transparent electrode 5 and pad electrode 7. The transparent conductive film 6 is patterned by etching similar to that of the first embodiment. Thus patterned transparent conductive film 6 covers not only the top surface but also side surfaces of transparent Pd electrode 5, covers the top surface of p type compound semiconductor layer 4 in the region having the width of at least about 5 μm from the side surfaces, and covers the side surfaces and the region having the width of at least about 5 μm at the periphery of the top surface of pad electrode 7.

Finally, in order to form electrical connection between the light emitting element and the outside, Au bonding wire 8 is connected to the central region of the top surface of pad electrode 7 not covered by transparent conductive film 6. On the other hand, n type electrode 9 is formed on the back surface of conductive n type GaN substrate 60.

In the light emitting element of FIG. 2 formed in this manner also, the transparent Pd electrode 5 having superior ohmic characteristic is completely shielded and protected by transparent conductive film 6 from the atmosphere or the mold resin. Therefore, the light transmission pattern of the light transmitting region is uniform, and deterioration of light emitting characteristic of the element caused by the reaction with hydrogen, oxygen and moisture from the atmosphere and the mold resin can be prevented.

Third Embodiment

Figure 3:
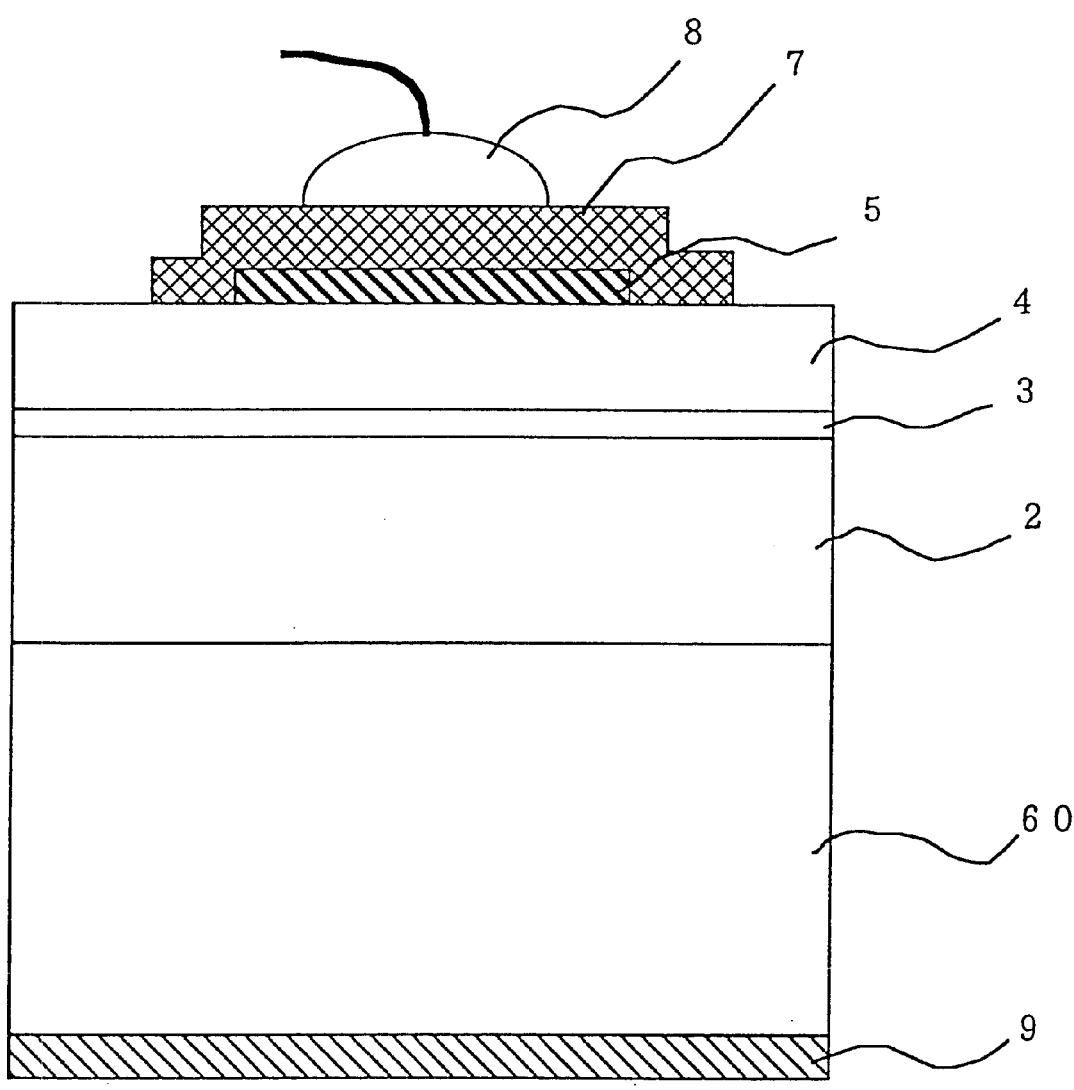
FIG. 3 is a schematic cross sectional view showing a stacked structure of a gallium nitride based compound semiconductor element in accordance with the third embodiment of the present invention.

FIG. 3 is a schematic cross sectional view showing a gallium nitride based compound semiconductor light emitting element in accordance with the third embodiment of the present invention. The light emitting element includes an n type GaN substrate 60, an n type gallium nitride based compound semiconductor layer 2, a gallium nitride based compound semiconductor light emitting layer 3, a p type gallium nitride based compound semiconductor layer 4, a p type Pd-containing transparent electrode 5, a pad electrode 7, an Au bonding wire 8 and an n type electrode 9.

In manufacturing the light emitting element shown in FIG. 3, first, on the n type GaN substrate 60, n type gallium nitride based compound semiconductor layer 2, gallium nitride based compound semiconductor light emitting layer 3 and p type gallium nitride based compound semiconductor layer 4 are stacked in this order by a known method. On the p type compound semiconductor layer 4, an ohmic electrode layer 5 of Pd having the thickness of about 14 μm is deposited. The ohmic electrode layer 5 is patterned to a circular electrode having the diameter of about 80 μm.

Thereafter, pad electrode layer 7 of Au having the thickness of about 500 nm is deposited to cover the top surface of p type semiconductor layer 4 and an exposed surface of ohmic electrode 5. Pad electrode 7 is patterned to a circular pad electrode having the diameter of about 120 μm. More specifically, pad electrode 7 covers not only the top and side surfaces of ohmic electrode 5 but also the top surface of p type gallium nitride based compound semiconductor layer 4 in the region in the width of about 20 μm from the side surfaces.

To form electric connection between the light emitting element and the outside, an Au bonding wire 8 is connected to pad electrode 7. Further, n type electrode 9 is formed on the back surface of n type GaN substrate 60.

In the light emitting element shown in FIG. 3 formed in this manner, the pad electrode 7 of Au serves to shield and protect ohmic electrode 5 containing Pd from the atmosphere or from the mold resin. Therefore, in the light emitting element of FIG. 3 also, degradation of the light emitting characteristic caused by the reaction of Pd contained in the ohmic electrode 5 with hydrogen, oxygen and moisture from the atmosphere and the mold resin can be prevented.

In the light emitting element in accordance with the present embodiment, in order that a number of light emitting element chips can be taken from one wafer, two-dimensional shape of the chip is made as small as about 200 μm square. For this purpose, only the ohmic Pd electrode 5 and a pad electrode 7 perfectly shielding the electrode from the atmosphere or the mold resin are formed on p type gallium nitride based compound semiconductor layer 4. In other words, in the present embodiment, it is unnecessary to use the transparent conductive film to shield the Pd electrode 5 from the atmosphere or from the mold resin. Therefore, the present embodiment additionally has the advantage that the method of manufacturing the element can be simplified.

Fourth Embodiment

Figure 4:
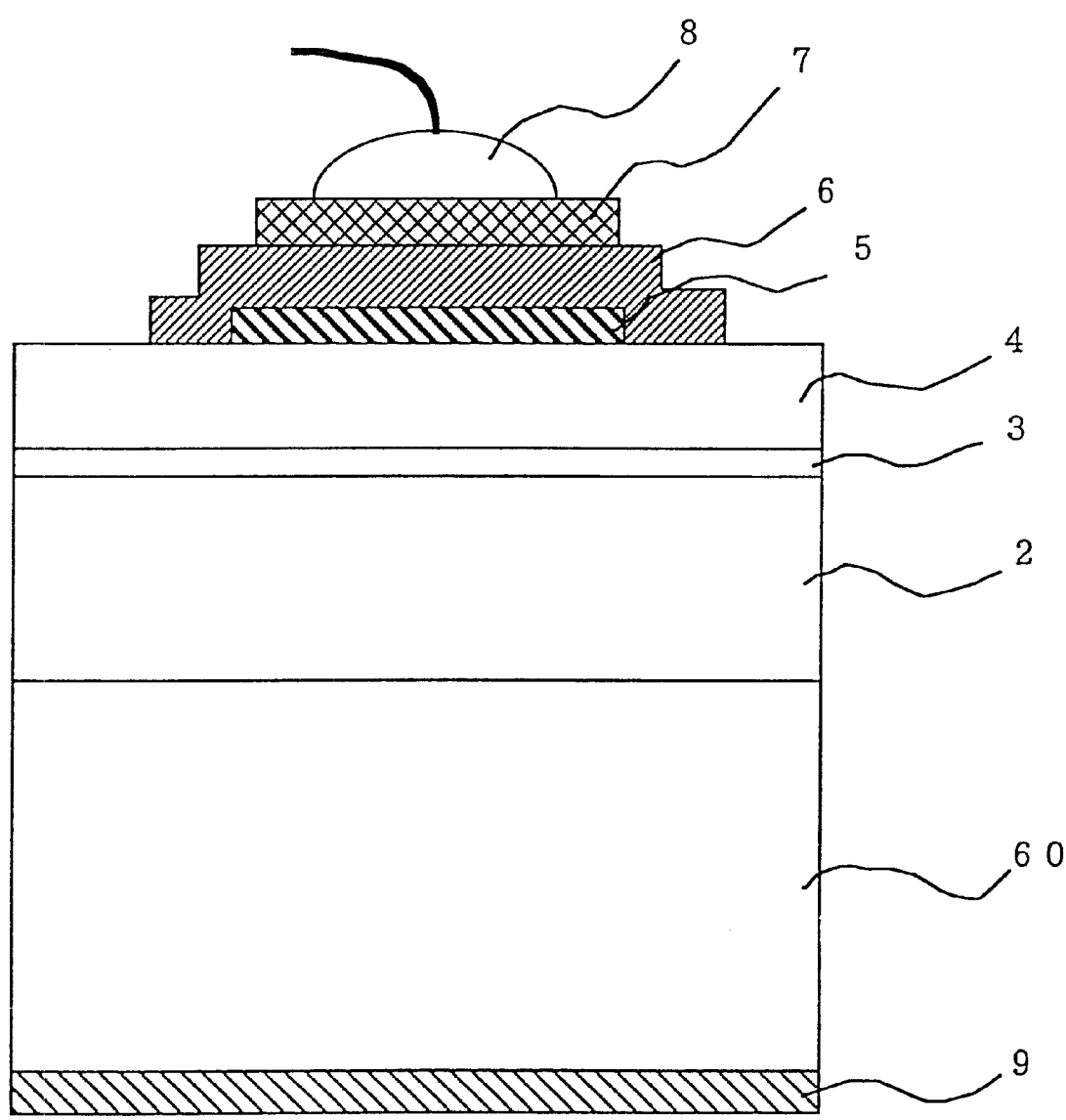
FIG. 4 is a schematic cross sectional view showing a stacked structure of a gallium nitride based compound semiconductor element in accordance with the fourth embodiment of the present invention.

FIG. 4 is a schematic cross sectional view showing a gallium nitride based compound semiconductor light emitting element in accordance with the fourth embodiment of the present invention. The light emitting element includes an n type GaN substrate 60, an n type gallium nitride based compound semiconductor layer 2, a gallium nitride based compound semiconductor light emitting layer 3, a p type gallium nitride based compound semiconductor layer 4, a transparent electrode 5, a transparent conductive film 6, a pad electrode 7, an Au bonding wire 8 and an n type electrode 9

In manufacturing such a light emitting element as shown in FIG. 4, first, on n type GaN substrate 60, n type gallium nitride based compound semiconductor layer 2, gallium nitride based compound semiconductor light emitting layer 3 and p type gallium nitride based compound semiconductor layer 4 are stacked in this order by a known method. On p type gallium nitride based compound semiconductor layer 4, a transparent Pd electrode layer 5 of Pd having the thickness of about 5 nm is deposited. The transparent electrode 5 is patterned by etching.

Thereafter, transparent conductive film 6 of Sn-doped In$_2$O$_3$ having the thickness of about 600 nm is formed to cover the top surface of p type semiconductor layer 4 and exposed surfaces of transparent electrode 5 and pad electrode 7. The transparent conductive film 6 is patterned by etching similar to that of the first embodiment. Thus patterned transparent conductive film 6 covers the top surface and side surfaces of transparent Pd electrode 5, and additionally covers the top surface of p type compound semiconductor layer 4 in the region having the width of at least about 15 μm from the side surfaces.

Thereafter, at a position corresponding to and above the transparent electrode 5, pad electrode 7 is formed on transparent conductive film 6. Pad electrode 7 may be formed to the thickness of about 300 nm using Au, and it is patterned by photolithography.

To form electric connection between the light emitting element and the outside, an Au bonding wire 8 is connected to pad electrode 7. Further, n type electrode 9 is formed on the back surface of n type GaN substrate 60.

In the light emitting element shown in FIG. 4 formed in this manner, transparent electrode 5 containing Pd is shielded perfectly by transparent conductive film 6 from the atmosphere or the mold resin. Therefore, degradation of the light emitting characteristic resulting from the reaction between Pd and hydrogen, oxygen and moisture from the atmosphere and from the mold resin can be prevented.

In this embodiment, transparent conductive film 6 and transparent electrode 5 are formed below Au pad electrode 7. Therefore, the light generated immediately below pad electrode 7 is not directly intercepted by pad electrode 7, and the light can be emitted upward through the space in which transparent electrode 5 and transparent conductive film 6 are interposed. Thus, a light emitting element having superior efficiency of external light emission can be obtained.

Though a light emitting element having a homostructure has been described as an example of the gallium nitride based compound semiconductor light emitting element in the embodiment above, the present invention is also applicable to light emitting elements of various other structures including double heterostructure and single heterostructure.

Though the p type ohmic electrode 5 containing Pd has been described, the electrode may be formed as a stacked body including Ni or Pt, or an alloy including Pd.

Though Sn-doped $In_2O_3$ has been described as the material of transparent conductive film 6, $SnO_2$, ZnO, $Cd_2SnO_4$, $CdSnO_3$ or the like may be used. Further, W, Mo, Zr, Ti, Sb, F or the like may be used, other than Sn, as the dopant of $In_2O_3$. Further, Sb, P, Te, W, Cl, F or the like may be used as the dopant of $SnO_2$. Further, Ta may be used as the dopant of $Cd_2SnO_4$, and Al, In, B, F or the like may be used as the dopant of ZnO.

Further, as a method of forming transparent conductive film 6, vapor deposition, sputtering, CVD or the like may be used.

In order to sufficiently protect the side surfaces of Pd-containing electrode 5, thickness of the transparent conductive film 6 should preferably be at least 0.1 $\mu$m and, in order to prevent decrease of light transmittance, the thickness should preferably be at most 30 $\mu$m.

When the side surfaces of Pd-containing electrode 5 are exposed, bumps are generated on the top surface of p type compound semiconductor layer 4 within the range of the width of about 5 $\mu$m from the side surfaces of electrode 5 because of bonding with hydrogen, oxygen and moisture from the atmosphere and from the mold resin. Therefore, it is preferred that regions of the top surface of p type compound semiconductor layer having the width of at least 5 $\mu$m from the side surfaces of electrode 5 should be covered by the shielding film.

In the fourth embodiment, thickness of the Au pad electrode 7 is set to 0.3 $\mu$m, as the thickness of at least 0.3 $\mu$m of the Au layer is sufficient for the pad for wire bonding. In order to prevent stress to the underlying semiconductor layer, the thickness of Au pad electrode 7 should preferably be at most 1.5 $\mu$m.

In order to shield Pd-containing electrode 5 from the atmosphere or from the mold resin, use of a transparent dielectric insulating film may be possible. Generally, however, film quality of the dielectric insulating film is not sufficient to serve as a protection film, as the pin hole density is about 1000 times larger than that of the transparent conductive film 6. Further, transparent conductive film 6 is preferable to assist conductivity of the very thin Pd-containing electrode.

As described above, according to the present invention, a gallium nitride based compound semiconductor light emitting element having a Pd-containing p type ohmic electrode can be provided, which can prevent degradation of light emitting characteristic caused by the reaction with the hydrogen, oxygen and moisture from the atmosphere and from the mold resin, and hence attains satisfactory ohmic characteristic, uniform light emitting pattern and high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride based semiconductor light emitting element including at least a gallium nitride based compound semiconductor layer of a first conductivity type and a gallium nitride based compound semiconductor layer of a second conductivity type stacked on a substrate, wherein a Pd-containing electrode is formed on a main region on a top surface of said semiconductor layer of the second conductivity type, and a top surface and side surfaces of the Pd-containing electrode and a surface of said semiconductor layer of the second conductivity type in a region having at least a prescribed width W from the side surfaces are covered by a conductive shielding film and shielded from atmosphere or a mold resin.

2. The nitride based semiconductor light emitting element according to claim 1, wherein said Pd-containing electrode is transparent, and said conductive shielding film is a transparent conductive film.

3. The nitride based semiconductor light emitting element according to claim 2, wherein a pad electrode is formed on a region of the top surface of said Pd-containing electrode, and said shielding film additionally covers side surfaces and a peripheral portion of a top surface of said pad electrode.

4. The nitride based semiconductor light emitting element according to claim 1, wherein said Pd-containing electrode is ohmic, and said conductive shielding film additionally serves as a pad electrode.

5. The nitride based semiconductor light emitting element according to claim 1, wherein said Pd-containing electrode includes a single layered or a multi-layered layered metal thin film.

6. The nitride based semiconductor light emitting element according to claim 2, wherein thickness of said transparent conductive film constituting said conductive shielding film is at least 0.1 $\mu$m and at most 30 $\mu$m, and said width W is at least 5 $\mu$m.

7. The nitride based semiconductor light emitting element according to claim 4, wherein said pad electrode additionally serving as said conductive shielding film includes at least gold (Au) and having a thickness of at least 0.3 $\mu$m and at most 1.5 $\mu$m, and said width W is at least 5 $\mu$m.

* * * * *